(12) United States Patent
Narushima et al.

(10) Patent No.: US 10,294,583 B2
(45) Date of Patent: May 21, 2019

(54) PRODUCING METHOD AND APPARATUS OF SILICON SINGLE CRYSTAL, AND SILICON SINGLE CRYSTAL INGOT

(75) Inventors: Yasuhito Narushima, Omura (JP); Shinichi Kawazoe, Omura (JP); Fukuo Ogawa, Omura (JP); Masahiro Irokawa, Omura (JP); Toshimichi Kubota, Omura (JP)

(73) Assignee: SUMCO TECHXIV CORPORATION, Nagasaki (JP)

( * ) Notice: Subject to any disclaimer, the term of this patent is extended or adjusted under 35 U.S.C. 154(b) by 0 days.

(21) Appl. No.: 12/597,116

(22) PCT Filed: Apr. 23, 2008

(86) PCT No.: PCT/JP2008/057862
§ 371 (c)(1),
(2), (4) Date: Oct. 22, 2009

(87) PCT Pub. No.: WO2008/133278
PCT Pub. Date: Nov. 6, 2008

(65) Prior Publication Data
US 2010/0294999 A1    Nov. 25, 2010

(30) Foreign Application Priority Data

Apr. 24, 2007   (JP) ................................ 2007-114183
Apr. 24, 2007   (JP) ................................ 2007-114184

(51) Int. Cl.
*C30B 15/04*     (2006.01)
*C30B 29/06*     (2006.01)

(52) U.S. Cl.
CPC .............. *C30B 15/04* (2013.01); *C30B 29/06* (2013.01); *Y10T 117/1008* (2015.01); *Y10T 117/1056* (2015.01)

(58) Field of Classification Search
CPC .......... C30B 15/04; C30B 29/06; C30B 15/20
(Continued)

(56) References Cited

U.S. PATENT DOCUMENTS 5,260,037 A * 11/1993 Kitaura ................... C30B 15/14
                                                    117/217
5,462,011 A * 10/1995 Tomzig ................... C30B 15/02
                                                     117/18
(Continued)

FOREIGN PATENT DOCUMENTS

FI          20450 B    *  3/2007
JP       59-190292       10/1984
(Continued)

OTHER PUBLICATIONS

Translation WO 2008010577 A1, 2008.*
(Continued)

*Primary Examiner* — Gregory R Delcotto
*Assistant Examiner* — Preeti Kumar
(74) *Attorney, Agent, or Firm* — Greenblum & Bernstein, P.L.C.

(57) ABSTRACT

The sublimation speed of dopant can be precisely controlled without being influenced by a change over time of intra-furnace thermal environment. A dopant supply unit equipped with an accommodation chamber and a supply tube is provided. A sublimable dopant is accommodated. Upon sublimation of the dopant within the accommodation chamber, the sublimed dopant is introduced into a melt. The dopant within the accommodation chamber of the dopant supply unit is heated. The amount of heating by means of heating means is controlled so as to sublime the dopant at a desired sublimation speed. The dopant is supplied to the melt so that the dopant concentration until the first half of a straight body portion of the silicon single crystal is in the (Continued)

state of low concentration or non-addition. After the first half of the straight body portion of the silicon single crystal is formed, the dopant is supplied to the melt so that every portion of the crystal is in the state where the dopant is added to a desired high concentration.

6 Claims, 4 Drawing Sheets

(58) Field of Classification Search
USPC .............................. 117/13, 14, 17, 19, 932
See application file for complete search history.

(56) References Cited

U.S. PATENT DOCUMENTS

| | | | | |
|---|---|---|---|---|
| 5,911,823 | A * | 6/1999 | Sonoda .................. | C30B 15/22 117/30 |
| 6,312,517 | B1 * | 11/2001 | Banan et al. .................... | 117/13 |
| 2007/0017433 | A1 * | 1/2007 | Sakurada .............. | C30B 15/203 117/13 |
| 2007/0186845 | A1 * | 8/2007 | Umeno .................. | C30B 15/04 117/13 |
| 2009/0314996 | A1 * | 12/2009 | Kawazoe ................ | C30B 29/06 252/500 |

FOREIGN PATENT DOCUMENTS

| | | | |
|---|---|---|---|
| JP | 1997-9227275 | * | 9/1997 |
| JP | 2003-532611 A1 | | 11/2003 |
| JP | 2003-532613 A1 | | 11/2003 |
| JP | 2005-247671 A1 | | 9/2005 |
| JP | 2005-336020 A1 | | 12/2005 |
| JP | 2006-010756 | * | 1/2006 |
| JP | WO2008010577 A1 | * | 1/2008 |
| WO | 01/86033 | | 11/2001 |

OTHER PUBLICATIONS

Bibliographic dateFI120450B, 2007.*
Czochralski process, Wikipedia, 2017.*
JPO translation of JP20060010756, 2017, pags. 1-12.*
JP1997-9227275 translation, 2017 pp. 1-12.*
International Search Report for International Application PCT/JP2008/057862 dated Jul. 9, 2008.

* cited by examiner

CROSS SECTION A-A

PRODUCING METHOD AND APPARATUS OF SILICON SINGLE CRYSTAL, AND SILICON SINGLE CRYSTAL INGOT

TECHNICAL FIELD

The present invention relates to a method for producing a silicon single crystal and an apparatus for producing the silicon single crystal by pulling up the silicon single crystal with a CZ method (Czochralski method) and so on, and also relates to a silicon single crystal ingot produced by using the producing apparatus and method.

BACKGROUND ART

Conventionally Practiced Art

The CZ method (Czochralski method) is a method in which melt is kept in a crucible within a CZ furnace; a dopant is supplied to the melt; a pulling mechanism pulls up, from the melt, a silicon single crystal having the dopant added thereto; and the silicon single crystal grows.

To impart an electrical property of N type to the silicon single crystal, a dopant (impurity element) for the N type, such as arsenic As, phosphorus P, and antimony Sb, is added to the silicon single crystal. Of those dopants, arsenic As and phosphorus P are sublimable dopants, and change directly from the solid phase to the gaseous phase at a relatively low temperature. There has been conventionally carried out a dopant supplying method in which the dopant is added to the silicon crystal by: lowering an accommodation chamber accommodating the sublimable dopants from the upper part in the CZ furnace to a prescribed position above the melt; heating the dopants accommodated in the accommodation chamber by radiant heat radiated from the melt to evaporate; and, introducing, from the accommodation chamber to the melt, the dopant that has becomes the gas as a result of the evaporation. Conventionally, as a method for introducing the dopant as described above, there has been provided a blowing method in which the dopant is introduced to the melt using a carrier gas, by positioning an opening end of a supplying tube to a prescribed position higher than the melt; and blowing the carrier gas from the supplying tube to the melt by using an inert gas such as argon gas as the carrier gas for transporting. As another method, there has been proposed a submerging method in which the supplying tube is submerged into the melt to introduce, from the supplying tube to the melt, the dopant that has become the gas as a result of evaporation.

(Conventional Art as Described in the Patent Document 1)

In the Patent Document 1, a tube assembly for supplying an impurity element is attached to a seed chuck of the pulling mechanism; the tube assembly for supplying the impurity element is lowered by the pulling mechanism until a dopant accommodation chamber of the tube assembly for supplying the impurity element is positioned about 285 mm above the melt surface; and, arsenic in the accommodation chamber is heated at this position by radiant heat radiated from the melt to evaporate. And, the tube assembly for supplying the impurity element is further lowered by the pulling mechanism until the supplying tube of the tube assembly for supplying the impurity element is contacted with the melt; and, the arsenic vapor is introduced from the supplying tube to the melt. Here, the position at which the dopant evaporates (position of about 285 mm above the melt surface) is obtained in advance from a result of analysis of a thermal model.

(Conventional Art as Described in the Patent Document 2)

In the Patent Document 2, the dopant accommodation chamber is arranged at a position that does not interfere with the pulling mechanism; the accommodation chamber is lowered from the upper part in the CZ furnace to a position higher than the upper surface of a quartz crucible; and the dopant in the accommodation chamber is melted at this position by the radiant heat radiated from the melt. Then, the accommodation chamber is further lowered to a position where it contacts with the melt, and the melted dopant is introduced from an opening surface of the accommodation chamber to the melt. Then, the accommodation chamber is further lowered to a position where it contacts with the melt, and the melted dopant is introduced from the opened surface of the accommodation chamber to the melt. The Patent Document 1 describes an invention in which, by introducing the dopant to the melt during the pulling process, a silicon single crystal ingot having different specific resistances, each of which discontinuously changes in a growth axis direction, is pulled up to grow in order to obtain a product that has dopant concentrations in accordance with user's purpose or specifications, etc.

Patent Document 1: Japanese Patent Application Laid-open (Translation of PCT Application) No. 2003-532611

Patent Document 2: Japanese Patent Application Laid-open No. 2005-336020

DISCLOSURE OF THE INVENTION

Problems to be Solved by the Invention

The introduction efficiency (absorption efficiency) of the dopant introduced into the melt depends upon the speed at which the dopant sublimes. By optimally setting the sublimation speed, the introduction efficiency can be maximized, which makes it possible to minimize the loss of dopant.

Additionally, the sublimation speed depends upon the amount of heat applied to the dopant. Thus, by heating the dopant with the optimum amount of heat, the introduction efficiency can be maximized.

According to the conventionally carried out technique and the technique of the Patent Document 1 as described above, the radiant heat that the dopant receives varies depending on the position where the dopant accommodation chamber is lowered above the melt, and the sublimation speed varies accordingly. If the dopant accommodation chamber is disposed long away from the melt, the sublimation speed becomes slow or the sublimation itself becomes difficult. On the contrary, if the dopant accommodation chamber is disposed near to the melt, the sublimation speed becomes fast. Variation in the sublimation speed results in variation in the introduction efficiency and the amount of introduction of the dopant to the melt. This affects the concentration of the dopant as well as the resistance value of the silicon single crystal. Thus, if the sublimation speed fluctuates, desired dopant concentration or resistance value cannot be achieved.

However, it is not easy to lower the dopant accommodation chamber to the optimum position; apply the optimum amount of heat of the radiant heat to the dopant; optimize the sublimation speed to maximize the introduction efficiency; and, make the concentration of the dopant and the resistivity of the silicon single crystal the desired values.

In other words, as described in the Patent Document 1, even if an optimum lowering position is obtained in advance from the simulation or experimental results, the sublimation speed may vary because the obtained lowering position is not always the optimum position due to the time-varying heat environment in the CZ furnace, namely, deterioration in the components in the furnace or other components with time. For example, the heater for heating the quartz crucible is made of carbon material, and the carbon material deteriorates with time. Once the deterioration of the heater occurs, the amount of heat from the radiant heat to be absorbed by the dopant varies with time, and the sublimation speed varies as well even if the dopant accommodation chamber is lowered to the same position.

As described above, the sublimation with the radiant heat is more likely to be affected by the change in components' state in the furnace (hot zone) over time, and hence the control of the sublimation speed is significantly difficult.

Additionally, the inventors of the present invention have found that, when the dopant is added in a high concentration to a silicon single crystal and the low-resistivity silicon single crystal of an N++ type is pulled to grow, the crystal is more likely to break. To prevent the crystal from breaking, precise control of the dopant concentration in the silicon single crystal is necessary by precisely controlling the sublimation speed of the sublimable dopants such as arsenic As and phosphorus P that imparts an electrical property of N type to the silicon single crystal.

The present invention has been made in view of the circumstances as described above, and the problem to be solved by the present invention is to precisely control the sublimation speed of the dopant without being affected by the time-varying heat environment in the furnace.

Here, to produce the low-resistivity and high-concentration silicon single crystal ingot having the electric property of N++ type, it is necessary to add a dopant for N type such as arsenic As and phosphorus P in a high concentration to the silicon single crystal.

However, the inventors of the present situation have found that, if the concentration of the dopant supplied to the melt prior to pulling is high, the crystal frequently turns to be the polycrystal from the shoulder process to the first half of the straight body process in the pulling up process at the time of pulling up the N++ type silicon single crystal.

The present invention has been made in view of the circumstances as described above, and the problem to be solved by the present invention is to stably pull up the low-resistivity silicon single crystal of N++ type having the dopant added thereto in the high concentration, without causing the crystal break to occur.

Note that, although the Patent Document 2 describes adding the dopant to the melt during the pulling-up process, the invention of the Patent Document 2, unlike the present invention, is not directed to the N++ type silicon single crystal, and the document does not indicate the problem of the occurrence of the crystal breaks at the time of pulling up the N++ type silicon single crystal.

Additionally, in the process of making the present invention, the inventors have found that, in a case of the submerging method in which the supplying tube is submerged into the melt to introduce to the melt the dopant in the gaseous form as a result of evaporation from the supplying tube, percentage of the single crystallization of the grown silicon single crystal deteriorates, and thus stable growth of the silicon single crystal becomes difficult.

The problem to be solved by the present invention is to, at the time of pulling up, stably grow the low-resistivity silicon single crystal of the N++ type having the dopant added thereto in the high concentration, without the single crystallization being impeded.

Means to Solve the Problems

A first aspect of the present invention provides a producing apparatus of a semiconductor single crystal, in which a dopant is supplied to melt kept in a crucible within a furnace; and the semiconductor single crystal having the dopant added thereto is pulled up from the melt by using a pulling mechanism to grow the semiconductor single crystal, the apparatus comprising: a dopant supply unit including an accommodation chamber that accommodates a sublimable dopant, and a supplying tube that, when the dopant in the accommodation chamber is sublimed, leads the sublimed dopant to the melt; heating means for heating the dopant in the accommodation chamber of the dopant supply unit; and control means for controlling an amount of heating by means of the heating means such that the dopant is sublimed at a desired sublimation speed.

A second aspect of the present invention provides the producing apparatus of a semiconductor single crystal according to the first aspect of the present invention, wherein the dopant supply unit is disposed at a position that does not interfere with the semiconductor single crystal and the pulling mechanism.

A third aspect of the present invention provides the producing apparatus of a semiconductor single crystal according to the first aspect of the present invention, wherein the dopant supply unit is disposed at a position where the supplying tube is not submerged into the melt, and the sublimed dopant is led to the melt by blowing the sublimed dopant from the supplying tube to the melt.

A fourth aspect of the present invention provides the producing apparatus of a semiconductor single crystal according to the second aspect of the present invention, wherein the dopant supply unit is disposed at a position where the supplying tube is not submerged into the melt, and the sublimed dopant is led to the melt by blowing the sublimed dopant from the supplying tube to the melt.

A fifth aspect of the present invention provides the producing apparatus of a semiconductor single crystal according to the first aspect of the present invention, wherein the control means feeds back an actual sublimation speed of the dopant during supply of the dopant, and controls the amount of heating such that the actual sublimation speed matches a target sublimation speed.

A sixth aspect of the present invention provides the producing apparatus of a semiconductor single crystal according to the second aspect of the present invention, wherein the control means feeds back an actual sublimation speed of the dopant during supply of the dopant, and controls the amount of heating such that the actual sublimation speed matches a target sublimation speed.

A seventh aspect of the present invention provides the producing apparatus of a semiconductor single crystal according to the third aspect of the present invention, wherein the control means feeds back an actual sublimation speed of the dopant during supply of the dopant, and controls the amount of heating such that the actual sublimation speed matches a target sublimation speed.

An eighth aspect of the present invention provides the producing apparatus of a semiconductor single crystal according to the fourth aspect of the present invention, wherein the control means feeds back an actual sublimation speed of the dopant during supply of the dopant, and controls the amount of heating such that the actual sublimation speed matches a target sublimation speed.

A ninth aspect of the present invention provides the producing apparatus of a semiconductor single crystal according to the first aspect of the present invention, wherein the control means controls the amount of heating in a current batch on the basis of a sublimation speed and the amount of heating in a previous batch.

A tenth aspect of the present invention provides the producing apparatus of a semiconductor single crystal according to the second aspect of the present invention, wherein the control means controls the amount of heating in a current batch on the basis of a sublimation speed and the amount of heating in a previous batch.

An eleventh aspect of the present invention provides the producing apparatus of a semiconductor single crystal according to the third aspect of the present invention, wherein the control means controls the amount of heating in a current batch on the basis of a sublimation speed and the amount of heating in a previous batch.

A twelfth aspect of the present invention provides the producing apparatus of a semiconductor single crystal according to the fourth aspect of the present, wherein the control means controls the amount of heating in a current batch on the basis of a sublimation speed and the amount of heating in a previous batch.

A thirteenth aspect of the present invention provides the producing apparatus of a semiconductor single crystal according to the first aspect of the present invention, wherein, by obtaining, in advance, a relationship between the sublimation speed and the amount of heating, the control means controls the amount of heating in accordance with the relationship obtained in advance.

A fourteenth aspect of the present invention provides the producing apparatus of a semiconductor single crystal according to the second aspect of the present invention, wherein, by obtaining, in advance, a relationship between the sublimation speed and the amount of heating, the control means controls the amount of heating in accordance with the relationship obtained in advance.

A fifteenth aspect of the present invention provides the producing apparatus of a semiconductor single crystal according to the third aspect of the present invention, wherein, by obtaining, in advance, a relationship between the sublimation speed and the amount of heating, the control means controls the amount of heating in accordance with the relationship obtained in advance.

A sixteenth aspect of the present invention provides the producing apparatus of a semiconductor single crystal according to the fourth aspect of the present invention, wherein, by obtaining, in advance, a relationship between the sublimation speed and the amount of heating, the control means controls the amount of heating in accordance with the relationship obtained in advance.

A seventeenth aspect of the present invention provides a producing method of a semiconductor single crystal, in which a dopant is supplied to melt kept in a crucible within a furnace; and the semiconductor single crystal having the dopant added thereto is pulled up from the melt to grow the semiconductor single crystal, wherein, by heating a sublimable dopant by heating means, the dopant is sublimated at a desired sublimation speed, and the sublimed dopant is led to the melt.

An eighteenth aspect of the present invention provides the producing method of a semiconductor single crystal according to the seventeenth aspect of the present invention, wherein the sublimed dopant is led to the melt while the semiconductor single crystal is being pulled up.

A nineteenth aspect of the present invention provides a producing method of a silicon single crystal, in which a dopant is supplied to melt kept in a crucible within a furnace; and the silicon single crystal having the dopant added thereto is pulled up from the melt to grow the silicon single crystal, wherein, at the time of producing the silicon single crystal having the dopant added thereto in a high concentration, the dopant is supplied to the melt in a state where the dopant is added in a low concentration or in a state where no dopant is added until the first half of a straight body portion of the silicon single crystal is formed, and in a state where the dopant is added in a desired high concentration after the first half of the straight body portion of the silicon single crystal is formed.

A twentieth aspect of the present invention provides the producing method of a silicon single crystal according to the nineteenth aspect of the present invention, wherein the dopant is a sublimable dopant, and a sublimed dopant is supplied to the melt by blowing the sublimed dopant to the melt.

A twenty-first aspect of the present invention provides the producing method of a silicon single crystal according to the nineteenth aspect of the present invention, wherein an N++ type silicon single crystal is produced by adding the dopant in the high concentration.

A twenty-second aspect of the present invention provides the producing method of a silicon single crystal according to the twentieth aspect of the present invention, wherein an N++ type silicon single crystal is produced by adding As or P in the high concentration as the dopant.

A twenty-third aspect of the present invention provides a producing apparatus of a silicon single crystal, in which a dopant is supplied to melt kept in a crucible within a furnace; and the silicon single crystal having the dopant added thereto is pulled up from the melt by using a pulling mechanism to grow the silicon single crystal, wherein the producing apparatus is designed to produce the silicon single crystal in which the dopant is added in a high concentration; a dopant supply unit is disposed at a position that does not interfere with the silicon single crystal and the pulling mechanism; and the dopant is supplied to the melt in a state where the dopant is added in a low concentration or in a state where no dopant is added until the first half of a straight body portion of the silicon single crystal is formed, and in a state where the dopant is added in a desired high concentration after the first half of the straight body portion of the silicon single crystal is formed.

A twenty-fourth aspect of the present invention provides the producing apparatus of a silicon single crystal according to the twenty-third aspect of the present invention, wherein the dopant is a sublimable dopant; the dopant supply unit is disposed at a position where a supplying tube is not submerged into the melt; and a sublimed dopant is led to the melt by blowing the sublimed dopant from the supplying tube to the melt.

A twenty-fifth aspect of the present invention provides the producing apparatus of a silicon single crystal according to the twenty-third aspect of the present invention, wherein an N++ type silicon single crystal is produced by adding the dopant in the high concentration.

A twenty-sixth aspect of the present invention provides the producing apparatus of a silicon single crystal according to the twenty-fourth aspect of the present invention, wherein an N++ type silicon single crystal is produced by adding As or P in the high concentration as the dopant.

A twenty-seventh aspect of the present invention provides a silicon single crystal ingot, which is in a state where a dopant is added in a low concentration or a state where no dopant is added from a shoulder portion to the first half of a straight body portion; and is in a state where the dopant is added in a high concentration from the first half of the straight body portion to a tail portion, the silicon single crystal ingot being provided with a low-resistivity, N++ type electric property.

A twenty-eighth aspect of the present invention provides a silicon single crystal ingot to which As or P is added as the dopant, wherein the silicon single crystal ingot is in a state where the dopant is added in a low concentration or a state where no dopant is added from a shoulder portion to the first half of a straight body portion; and is in a state where the dopant is added in a high concentration from the first half of the straight body portion to a tail portion, the silicon single crystal ingot being provided with a low-resistivity, N++ type electric property.

According to the first aspect of the present invention, as shown in FIG. 1, a dopant supply unit 20 having an accommodation chamber 21 and a supplying tube 22 is provided. The accommodation chamber 21 accommodates a sublimable dopant 23. When the dopant 23 in the accommodation chamber 21 is sublimed, the supplying tube 22 leads the sublimed dopant 23 to melt 5. Heating means 30 heats the dopant 23 in the accommodation chamber 21 of the dopant supply unit 20. Control means 40 controls the amount of heating with the heating means 30 such that the dopant 23 is sublimed at a desired sublimation speed.

Accordingly, the amount of heating with the heating means 30 is controlled, and the dopant 23 in the accommodation chamber 21 is sublimed at the desired sublimation speed. Once the dopant 23 in the accommodation chamber 21 is sublimed, the sublimed dopant 23 is led to the melt 5 via the supplying tube 22, and is introduced to the melt 5.

According to the present invention, the heat adjusted by the heating means 30 and controlled by the control means 40, rather than with the radiant heat from the melt 5, is supplied to the dopant 23 and the dopant 23 is sublimed. Thus, unlike the sublimation with the radiant heat, the sublimation is not affected by the variation in the components in the furnace (hot zone) across the ages. This makes it possible to significantly precisely control the sublimation speed. Thus, optimum amount of heat can be stably applied to the dopant 23 without variation, and hence the sublimation speed can be optimized. Then, the introduction efficiency of the dopant to the melt 5 is maximized, whereby the dopant concentration and the resistance value of the silicon single crystal can be precisely controlled to the desired values. Furthermore, as described above, the crystal break is more likely to occur at the time when the dopant is added in the high concentration and the low-resistivity silicon single crystal of the N++ type is pulled. However, according to the present invention, it becomes possible to precisely control the dopant concentration in the silicon single crystal by precisely controlling the sublimation speed of the sublimable dopant such as arsenic As and phosphorus P, which impart an electrical property of N type to the silicon single crystal. This enables achieving precise control so as not to break the crystal. Note that "low-resistivity silicon single crystal of N++ type" herein refers to an N-type silicon single crystal having the specific resistance value smaller than 0.01 Ω·cm.

According to the second aspect of the present invention, as shown in FIG. 1, the dopant supply unit 20 is disposed at a position that does not interfere with a semiconductor single crystal 6 and a pulling mechanism 4. This makes it possible to lead the sublimed dopant 23 to the melt 5 while the semiconductor single crystal 6 is being pulled up. Thus, in a case of additional doping and so on, extremely precise control of doping during the pulling up becomes possible.

According to the third and the fourth aspects of the present invention, the dopant supply unit 20 is disposed at a position where the supplying tube 22 does not submerge into the melt 5, and the sublimed dopant 23 is led to the melt 5 by blowing the sublimed dopant 23 to the melt 5 from the supplying tube 22. According to the third and the fourth aspects of the present invention, the dopant 23 is introduced to the melt 5 through the blowing method described above.

According to the fifth, the sixth, the seventh, and the eighth aspects of the present invention, as shown in FIG. 1, the control means 40 feeds back the actual sublimation speed of the dopant 23 (the amount of change in weight of the dopant 23) while the dopant is being supplied, and controls the amount of heating such that the actual sublimation speed matches the target sublimation speed.

According to the ninth, the tenth, the eleventh, and the twelfth aspects of the present invention, as shown in FIG. 3, the control means 40 controls the amount of heating in a current batch in accordance with the sublimation speed and the amount of heating in a previous batch.

According to the thirteenth, the fourteenth, the fifteenth, and the sixteenth aspects of the present invention, as shown in FIG. 4, by obtaining, in advance, a relationship between the sublimation speed and the amount of heating, the control means 40 controls the amount of heating in accordance with the relationship obtained in advance.

The seventeenth aspect of the present invention is a method invention corresponding to the apparatus invention of the first aspect of the present invention. The eighteenth aspect of the present invention is a method invention corresponding to the apparatus invention of the second aspect of the present invention.

Hereinbelow, the nineteenth to the twenty-eighth aspects of the present invention will be described.

The inventors of the present invention have found that, in a case where the low-resistivity silicon single crystal of the N++ type is pulled and grown by adding the dopant 23 in the high concentration to the silicon single crystal 6, the crystal is more likely to break at the time of pulling up the crystal after the large amount of dopant necessary for obtaining the high concentration is introduced to the melt 5. The inventors of the present invention also have found that, to prevent the crystal from breaking, it is necessary that the low-concentration dopant 23 or no dopant 23 is supplied to the melt 5 until the first half of a straight body of the silicon single crystal 6 is formed, and the dopant 23 is added in a desired high concentration after the first half of the straight body of the silicon single crystal 6 is formed. It is considered that this is because, if the large amount of dopant 23 is introduced to the melt 5 before the crystal growth, abnormal growth occurs due to the locally uneven concentration of the dopant in the melt 5. Note that "low-resistivity silicon single crystal of N++ type" herein refers to an N-type silicon single crystal having the specific resistance value smaller than 0.01 Ω·cm.

Therefore, in the present invention, the dopant 23 is supplied to the melt 5 such that the concentration of the dopant is a low concentration or no dopant is added until the first half of the straight body of the silicon single crystal 6 is formed. Here, the low concentration refers to a concentration in which the concentration of the dopant 23 in the silicon single crystal 6 is equal to or lower than 1.6E19 atoms/cm$^3$, and the specific resistance value of the silicon single crystal 6 is equal to or higher than 4 mΩ·cm (high resistance).

Additionally, after the first half of the straight body of the silicon single crystal 6 is formed, the dopant 23 is supplied to the melt 5 such that every portion of the crystal has the dopant 23 added in the desired high concentration.

According to the present invention, without causing the crystal break to occur, it becomes possible to stably pull up the low-resistivity silicon single crystal of the N++ type having the dopant 23 added thereto in the high concentration.

According to the twentieth aspect of the present invention, the dopant 23 is sublimable, and the sublimed dopant 23 is supplied to the melt 5 by blowing the sublimed dopant 23 to the melt 5. According to the twentieth aspect of the present invention, the dopant 23 is introduced to the melt 5 through the blowing method described above. With this blowing method, the crystal is less likely to break and the single crystal can be more stably grown as compared with the submerging method. It is considered that this is because, at the time when the supplying tube 22 is submerged in the melt 5, liquid vibration occurs in the melt 5 or temperature of the melt is lowered, in other words, change in the convection of the melt 5 occurs. This deteriorates the percentage of the single crystallization of the silicon single crystal during the growth. As a result, stable growth of the silicon single crystal becomes difficult. Accordingly, as compared with the submerging method, it is suitable to apply the blowing method to the case of pulling and growing the high-concentration, low-resistivity N++ type silicon single crystal 6 in which the crystal break is, in the first place, more likely to occur. According to the present invention, at the time of pulling up, the low-resistivity silicon single crystal 6 of the N++ type having the dopant 23 added thereto in the high concentration can be stably grown, without the single crystallization being impeded.

According to the twenty-first aspect of the present invention, by adding the dopant 23 in a high concentration, the N++ type silicon single crystal 6 is produced.

According to the twenty-second aspect of the present invention, by adding As or P in a high concentration as the dopant 23, the N++ type silicon single crystal 6 is produced.

The twenty-third aspect of the present invention provides an apparatus for producing the silicon single crystal 6 in which the dopant 23 is added in the high concentration, and as shown in FIG. 1, the dopant supply unit 20 is disposed at a position that does not interfere with the silicon single crystal 6 and the pulling mechanism 4. This makes it possible to guide the sublimed dopant 23 to the melt 5 while the silicon single crystal is being pulled. As is the case with the nineteenth aspect of the present invention, the concentration of the dopant 23 to be added is low or no dopant 23 is added until the first half of the straight body of the silicon single crystal 6 is formed. Upon formation of the first half of the straight body of the silicon single crystal 6, the sublimed dopant 23 is introduced to the melt 5 by using the dopant supply unit 20 while the silicon single crystal 6 is being pulled, and then the silicon single crystal 6 results in a state where the desired high concentrate of the dopant 23 is added.

The twenty-fourth aspect of the present invention is an apparatus invention corresponding to the method invention of the twentieth aspect of the present invention.

The twenty-fifth aspect of the present invention is an apparatus invention corresponding to the method invention of the twenty-first aspect of the present invention.

The twenty-sixth aspect of the present invention is an apparatus invention corresponding to the method invention of the twenty-second aspect of the present invention.

The twenty-seventh aspect of the present invention is a silicon single crystal 6 produced by using the method of the twenty-first aspect of the present invention or the apparatus of the twenty-fifth aspect of the present invention. This silicon single crystal ingot 6 is in a state where the dopant 23 is added in the low concentration or no dopant 23 is added from a shoulder portion to the first half of the straight body; and in a state where the dopant 23 is added in the high concentration from the first half of the straight body to a tail portion to impart the electric properties of low resistivity and N++ type.

The twenty-eighth aspect of the present invention is a silicon single crystal 6 produced by using the method of the twenty-second aspect of the present invention or the apparatus of the twenty-sixth aspect of the present invention. As or P is added to this silicon single crystal ingot 6 as the dopant 23. Additionally, this silicon single crystal ingot 6 is in a state where the dopant 23 is added in the low concentration or no dopant 23 is added from a shoulder portion to the first half of the straight body; and in a state where the dopant 23 is added in the high concentration from the first half of the straight body to a tail portion to impart the electric properties of low resistivity and N++ type.

BEST MODE FOR CARRYING OUT THE INVENTION

With reference to the drawings, embodied apparatuses will be described below.

First Example

FIG. 1 is a diagram illustrating a configuration of an apparatus of a first example as viewed from the side.

As shown in FIG. 1, a single crystal pulling apparatus 1 of the first example has a CZ furnace (chamber) 2 as a container for use in pulling up a single crystal.

The CZ furnace 2 has a crucible 3 for melting a raw material of polycrystalline silicon (Si) and accommodating melt 5. The crucible 3 is made, for example, of quartz. Around the crucible 3, a heater 9 for heating the raw material in the crucible 3 to melt is provided.

Between the heater 9 and an inner wall of the CZ furnace 2, an insulating tube 13 is provided.

Above the crucible 3, a pulling mechanism 4 is provided. The pulling mechanism 4 comprises a pulling-up cable 4a, and a seed crystal holder 4b on the tip of the pulling-up cable 4a. A seed crystal is held by the seed crystal holder 4b.

The raw material is heated in the crucible 3 to be molten. Once the melting becomes stable, the pulling mechanism 4 is activated, and the silicon single crystal (silicon single crystal ingot) 6 is pulled up from the melt 5 by using the CZ method. In other words, the pulling-up cable 4a is lowered, and the seed crystal held by the seed crystal holder 4b on the tip of the pulling-up cable 4a is dipped into the melt 5. After the seed crystal is sufficiently dipped into the melt 5, the pulling-up cable 4a is raised. The silicon single crystal 6 grows as the seed crystal held by the seed crystal holder 4b ascends. At the time of pulling up, the crucible 3 is rotated with a rotating shaft 10. Additionally, the pulling-up cable 4a of the pulling mechanism 4 rotates in the direction opposite to or same as the rotation of the rotating shaft 10. Furthermore, the rotating shaft 10 can be driven in the vertical direction, and vertically move the crucible 3 to place the crucible 3 at a desired position in the vertical direction.

The inside of the CZ furnace 2 is sealed from the outside air, and the pressure within the furnace 2 is maintained under vacuum (e.g., about several tens Torr). In other words, argon gas 7 is supplied as the inert gas into the CZ furnace 2, and is discharged from an exhaust port of the CZ furnace 2 by a pump. As a result, the pressure within the furnace 2 can be reduced to a prescribed pressure.

During the single crystal pulling-up process (1 batch), various kinds of evaporated matters appear in the CZ furnace 2. Thus, the argon gas 7 is supplied to the CZ furnace 2, and is discharged in conjunction with the evaporated matters to the outside of the furnace 2 to eliminate the evaporated matters from the inside of the furnace 2, thereby making the inside of the furnace 2 clean. The flow rate of the argon gas 7 supplied is set for each process in one batch.

As the silicon single crystal 6 is pulled up, the melt 5 decreases. With the decrease in the melt 5, the area where the melt 5 is contacted with the crucible 3 changes, and the amount of oxygen dissolution from the crucible 3 changes accordingly. This change has an influence on the distribution of oxygen concentration in the pulled-up silicon single crystal 6.

Above the crucible 3, a heat shielding plate 8 (gas flow straightening cylinder) is provided around the silicon single crystal 6. With the heat shielding plate 8, the argon gas 7 serving as a carrier gas supplied from the upper portion within the CZ furnace 2 is guided to the center of a melt surface 5a; is made pass through on the melt surface 5a; and is led to the peripheral edge of the melt surface 5a. Then, the argon gas 7, together with gas evaporated from the melt 5, is discharged from the exhaust port provided to the lower portion of the CZ furnace 2. As a result, the velocity of gas flow on the melt surface can be stabilized, whereby oxygen evaporated from the melt 5 can be kept in a stable condition.

Additionally, the heat shielding plate 8 insulates and isolates the seed crystal and the silicon single crystal 6, which is grown from the seed crystal, from the radiant heat generated from higher-temperature portions such as the crucible 3, the melt 5, and the heater 9. Furthermore, by preventing the impurities (e.g., silicon oxide), etc. generated in the furnace from attaching to the silicon single crystal 6, the heat shielding plate 8 avoids the inhibition of the growth of the single crystal. A distance D between the lower end of the heat shielding plate 8 and the melt surface 5a can be adjusted by raising or lowering the rotating axis 10, and changing the position of the crucible 3 in the vertical direction. Additionally, the distance D may be adjusted by moving the heat shielding plate 8 in the vertical direction by using a lifting and lowering apparatus.

Next, a configuration of a dopant supply unit in the apparatus of this example will be described.

In this example, to impart the electric property of N-type to the silicon single crystal 6, arsenic As or phosphorus P is added to the silicon single crystal 6 as a dopant (impurity) for N-type. These dopants are sublimable dopants, and change directly from the solid phase to the gaseous phase at a relatively low temperature.

As shown in FIG. 1, the dopant supply unit 20 comprises an accommodation chamber 21, a supplying tube 22, a carrier gas introduction tube 24, and a flow rate control unit 25. The accommodation chamber 21 accommodates a sublimable dopant 23. The supplying tube 22 is connected with the accommodation chamber 21. When the dopant 23 in the accommodation chamber 21 is sublimed, the supplying tube 22 lead the sublimed dopant 23 to the melt 5. The carrier gas introduction tube 24 is connected with the accommodation chamber 21, and introduces to the accommodation chamber 21 a carrier gas 17 that is used for transporting the dopant and is supplied from a gas supplier, which is not shown. The carrier gas 17 prevents the sublimed dopant 23 from remaining in the accommodation chamber 21, and efficiently leads the sublimed dopant 23 to the melt 5 through the supplying tube 22.

The accommodation chamber 21, the supplying tube 22, and the carrier gas introduction tube 24 of the dopant supply unit 20 are made, for example, of quartz.

The flow rate control unit 25 controls the flow rate (volumetric flow rate) of the carrier gas 17 that is led to the accommodation chamber 21 through the introduction tube 24, and that heads toward the melt 5 through the supplying tube 22. The flow rate is controlled by adjusting an opening area of a valve. The inert gas such as argon gas is employed for the carrier gas 17.

FIG. 2 is a sectional view taken along the line A-A of the accommodation chamber 21 of the dopant supply unit 20 shown in FIG. 1. A heater 30 as heating means is formed in an annular ring shape that surrounds the circumference of the accommodation chamber 21, and heats the dopant 23 in the accommodation chamber 21. For example, an electric resistance heating is employed for the heater 30.

The accommodation chamber 21 is provided with a load cell 26 as a weighing instrument for detecting the weight of the dopant 23. The sublimation speed of the dopant 23 can be obtained as the amount of change in weight of the dopant 23 in the accommodation chamber 21 that changes because of evaporation of the dopant 23. For this reason, the sublimation speed can be obtained from the detected results of the load cell 26.

The controller 40 as control means controls the amount of heating with the heater 30 such that the dopant 23 is sublimed at a desired sublimation speed.

During a period of time when the sublimed dopant 23 is supplied to the melt 5, the controller 40 monitors the weight of the dopant 23 in the accommodation chamber 21 detected by the load cell 26; feeds back the amount of change in weight as the actual sublimation speed of the dopant 23; adjusts the electrical power applied to the heater 30 such that the fed back actual sublimation speed matches the target sublimation speed; controls the amount of heating the dopant with the heater 30; and, controls the flow rate of the carrier gas 17 by adjusting the opening area of the valve of the flow rate control unit 25. The controller 40 controls such that, as the change in weight of the dopant 23 in the accommodation chamber 21 increases, the electric power applied to the heater 30 decreases and the flow rate of the carrier gas 17 decreases. Note that the flow rate of the carrier gas 17 may be kept in a constant value.

As shown in FIG. 1, the dopant supply unit 20 is disposed at a position that does not interfere with the silicon single crystal 6 and the pulling mechanism 4. This makes it possible to lead the sublimed dopant 23 to the melt 5 while the silicon single crystal 6 is being pulled up.

The dopant supply unit 20 is disposed at the position where the supplying tube 22 does not submerge into the melt 5.

As a result, with the supplying tube 22, the sublimed dopant 23 is blown and led to the melt 5. In other words, in this example, the dopant 23 is introduced to the melt 5 through the blowing method described above.

The dopant supply unit 20 is disposed in the furnace 2 at a position where the dopant 23 in the accommodation chamber 21 is not affected by the radiant heat from the melt 5, etc., and where the introduction efficiency of the dopant to the melt 5 is maximized at the time when the dopant 23 is blown to the melt 5 with the supplying tube 22. The distance between an opening end 22a of the supplying tube 22 and the melt 5 is desirably 10 mm or shorter.

Incidentally, the inventors of the present application have found that, when the dopant 23 is added in the high concentration to the silicon single crystal 6 and the low-resistivity silicon single crystal of the N++ type is pulled and grown, the crystal is more likely to break if the crystal is pulled after the large amount of dopant 23 required for making the crystal high concentration is introduced to the melt 5. The inventors of the present invention also have found that the crystal break can be prevented by supplying the dopant 23 to the melt 5 in a state where the dopant 23 is added in the low concentration or no dopant 23 is added until the first half of the straight body of the silicon single crystal 6 is formed, and in a state where the dopant 23 is added in the desired high concentration after the first half of the straight body of the silicon single crystal 6 is formed. It is considered that this is because, if the large amount of dopant 23 is introduced to the melt 5 before the crystal growth, abnormal growth occurs due to the locally uneven concentration of the dopant in the melt 5.

FIGS. 5, 6, and 7 are graphs showing relationships between the growth position of the silicon single crystal 6 and the frequency of occurrence of the crystal break.

FIG. 5 includes graphs showing a case where the dopant 23 is not introduced to the melt 5 before the crystal growth (non dope), and the concentration of the dopant in the pulled-up silicon single crystal 6 is 0 atoms/cm$^3$.

FIG. 5A shows a relationship between a position in a shoulder portion (shoulder length: unit in mm) of the silicon single crystal 6 and frequency of the break occurrence. FIG. 5B shows a relationship between a position in a straight body portion (straight body length: unit in mm) of the silicon single crystal 6 and frequency of the break occurrence. FIG. 5 shows data obtained by pulling up the silicon single crystal 6 twice.

As can be seen from FIG. 5, the crystal break did not occur from the shoulder portion to the first half of the straight body in the silicon single crystal 6.

FIG. 6 includes graphs showing a case where a raw material of polycrystalline silicon of 80 kg is charged to the crucible 3; As of 400 g is introduced to the melt 5 as the dopant 23; the dopant concentration in the pulled-up silicon single crystal 6 having 200 mm diameter becomes 1.6E19 atoms/cm$^3$; and the specific resistance value thereof becomes 4 mΩ-cm. FIG. 6A shows a relationship between a position in the shoulder portion (shoulder length: unit in mm) of the silicon single crystal 6 and the frequency of the break occurrence, and FIG. 6B shows a relationship between a position in the straight body portion (straight body length: unit in mm) of the silicon single crystal 6 and the frequency of the break. FIG. 6 shows data obtained by pulling up the silicon single crystal 6 twelve times.

As can be seen from FIG. 6, the number of crystal break occurrence is nine in the position of 75 mm-100 mm in the shoulder portion of the silicon single crystal 6; the number of crystal break occurrence is two in the position of 100 mm-120 mm in the shoulder position; and the number of crystal break occurrence is one in the position of 0 mm-25 mm in the straight body portion of the silicon single crystal 6.

FIG. 7 includes graphs showing a case where a raw material of polycrystalline silicon of 80 kg is charged to the crucible 3; the dopant 23 of 700 g is introduced to the melt 5; the dopant concentration in the pulled-up silicon single crystal 6 becomes 1.9E19 atoms/cm$^3$; and the specific resistance value thereof becomes 3.5 mΩ-cm. FIG. 7A shows a relationship between the position in the shoulder portion (shoulder length: unit in mm) of the silicon single crystal 6 and the frequency of the break occurrence, and FIG. 7B shows a relationship between the position in the straight body portion (straight body length: unit in mm) of the silicon single crystal 6 and the frequency of the break occurrence. FIG. 5 shows data obtained by pulling up the silicon single crystal 6 twenty-six times.

As can be seen from FIG. 7, the number of crystal break occurrence is two in the position of 25 mm-50 mm in the shoulder portion of the silicon single crystal 6; the number of crystal break occurrence is three in the position of 50 mm-75 mm in the shoulder position; and the number of crystal break occurrence is ten in the position of 75 mm-100 mm in the shoulder portion; the number of crystal break occurrence is one in the position of 100 mm-120 mm in the shoulder portion; and the number of crystal break occurrence is ten in the position of 0 mm-25 mm in the straight body portion of the silicon single crystal 6.

As can be seen from FIGS. 5, 6 and 7, it can be understood that the crystal break does not occur if, until the first half of the straight body portion of the silicon single crystal 6 is formed, the dopant concentration is set to the low concentration of 1.6E19 atoms/cm$^3$ or lower, in other words, to such low concentration that the specific resistance value of the silicon single crystal 6 of 4 mΩ-cm or higher (high resistance) can be obtained, or no dopant is added (non dope).

Therefore, in this example, until the first half of the straight body portion of the silicon single crystal 6 is formed, the dopant concentration is set to the low concentration of 1.6E19 atoms/cm$^3$, a low concentration state in which the specific resistance value of the silicon single crystal 6 is 4 mΩ-cm or higher or a state in which no dopant is added (non dope). And, after the first half of the straight body portion, where there is no possibility of the crystal break, the dopant 23 is added such that the crystal 6 has the desired high concentration and the low resistance. This makes it possible to stably pull up the silicon single crystal 6 without occurrence of the crystal break.

Next, control of the amount of dopant supplied from the beginning of growth of the silicon single crystal 6 to the end of growth will be described in detail.

(Initial Doping to the Melt 5)

A low concentration dopant 23 is added in advance to the melt 5 prior to pulling up the silicon single crystal 6. As for the method for adding the dopant 23 to the melt 5 prior to pulling up the silicon single crystal 6, it may be possible to employ either a conventional adding method that does not use the dopant supply unit 20 of this example, or a method which uses the dopant supply unit 20 of this example.

By doping the low-concentration dopant 23 to the melt 5 as described above and then pulling up the silicon single crystal 6, the concentration of the dopant until the first half of the straight body portion of the silicon single crystal 6 is formed becomes low.

(Doping to Melt 5 in the Latter Half)

Once the first half of the straight body portion of the silicon single crystal 6 is formed, the sublimed dopant 23 is then doped to the melt 5 by using the dopant supply unit 20 of this example such that the desired high concentration of the dopant is added.

The controller 40 starts to control the heater 30 and the flow rate control unit 25 at some midpoint in the pulling-up process such that the additional amount of the dopant 23 is doped to the melt 5 at some midpoint in the pulling-up of the silicon single crystal 6.

Once the controller 40 gives an electric power instruction to the heater 30, the electric power according to the electric power instruction is supplied to the heater 30, and the heater 30 generates heat. As the heater 30 generates heat, the heat is absorbed by the dopant 23 in the accommodation chamber 21, whereby the dopant 23 in the accommodation chamber is sublimed to evaporate.

Once the controller 40 gives a flow rate instruction to the flow rate control unit 25, the carrier gas 17 flows in the supplying tube 22 from the introduction tube 24 through the accommodation chamber 21 at a flow rate according to the flow rate instruction, and is blown from the supplying tube 22 toward the melt 5.

As a result, the dopant 23 sublimed in the accommodation chamber 21 to a gaseous form is delivered by the carrier gas 17, and is blown to the melt from the supplying tube 22, whereby the dopant 23 is introduced to the melt 5.

While the dopant 23 is being supplied to the melt 5, the controller 40 monitors the weight of the dopant 23 detected by the load cell 26; feeds back the amount of change in weight of the dopant 23 as the actual sublimation speed of the dopant 23; adjusts the electrical power applied to the heater 30 such that the fed back actual sublimation speed matches the target sublimation speed; controls the amount of heating the dopant with the heater 30; and, controls the flow rate of the carrier gas 17 by adjusting the opening area of the valve of the flow rate control unit 25.

As described above, the dopant 23 is sublimed at the desired sublimation speed, and the desired concentration of the dopant 23 is additionally doped to the melt 5. With the process above, each part of the crystal after the first half of the straight body portion of the silicon single crystal 6 is formed becomes a state where the dopant 23 is added in the desired high concentration. As described above, according to this example, the low-resistivity silicon single crystal 6 of the N++ type having the dopant 23 added thereto in the high concentration can be stably grown without occurrence of the crystal break.

Additionally, according to this example, the dopant 23 is sublimed by supplying the dopant 23 with the heat adjusted by the heater 30 and controlled by the controller 40, rather than the radiant heat from the melt 5. Thus, unlike the sublimation by the radiant heat, the sublimation is not affected by variation in the components in the furnace (hot zone) across the ages. This makes it possible to significantly precisely control the sublimation speed. Thus, optimum amount of heat can be stably applied to the dopant 23 without variation at all the time, and hence the sublimation speed can be optimized. Then, the introduction efficiency of the dopant to the melt 5 is maximized, whereby the dopant concentration and the resistance value of the silicon single crystal 6 can be precisely controlled to the desired high concentration and low resistivity, respectively.

Additionally, as described above, the crystal break is more likely to occur at the time of pulling up and growing the low-resistivity silicon single crystal 6 of the N++ type having the dopant added thereto in the high concentration. However, according to this example, it becomes possible to precisely control the dopant concentration in the silicon single crystal 6 by precisely controlling the sublimation speed of the sublimable dopant such as arsenic As and phosphorus P, which impart an electrical property of N type to the silicon single crystal 6, whereby precise control can be realized without occurrence of the crystal break.

Additionally, the dopant supply unit 20 is disposed at a position that does not interfere with the silicon single crystal 6 and the pulling mechanism 4. This makes it possible to lead the sublimed dopant 23 to the melt 5 while the silicon single crystal 6 is being pulled up. Thus, in a case of additional doping and so on, extremely precise control of doping during the pulling up becomes possible.

Additionally, according to this example, the dopant supply unit 20 is disposed at a position where the supplying tube 22 does not submerge into the melt 5, and the sublimed dopant 23 is led to the melt 5 by blowing the sublimed dopant 23 to the melt 5 from the supplying tube 22. With this blowing method, the crystal break is less likely to occur and the single crystal can be more stably grown as compared with the submerging method. It is considered that this is because, at the time when the supplying tube 22 is submerged in the melt 5, liquid vibration occurs in the melt 5 or temperature of the melt is lowered, in other words, change in convection of the melt 5 occurs. This deteriorates the percentage of the single crystallization of the silicon single crystal during the growth, whereby stable growth of the silicon single crystal becomes difficult. Accordingly, as compared with the submerging method, the blowing method is suitable for the case of pulling and growing the high-concentration, low-resistivity silicon single crystal 6 of the N++ type, in which the crystal break is, in the first place, more likely to occur.

Second Example

In the above-described first example, the actual sublimation speed of the dopant 23 (the amount of change in weight of the dopant 23) is fed back during the dopant supply, and the amount of heating with the heater 30 is controlled such that the actual sublimation speed matches the target sublimation speed. However, this control is only one example. It may be possible to employ a configuration in which other control device as shown in FIG. 3 is used.

Hereinbelow, while a description of the components same as those in the first example will be omitted as appropriate, components differing from those in the first example will be described.

In the control device as shown in FIG. 3, the controller 40 controls the amount of heating in a current batch in accordance with the sublimation speed and the amount of heating in a previous batch.

In other words, by conducting experiments in advance, the relationship between the electric power (amount of heating) to be applied to the heater 30 and the sublimation speed is stored in a storing unit 41.

The controller 40 controls an electric power applied to the heater 30 by reading the data stored in the storing unit 41, and giving an electric power instruction to the heater 30 so as to maintain the electric power corresponding to the desired sublimation speed during one batch. Note that the flow rate of the carrier gas 17 is kept in a constant value during the one batch. During the one batch, the weight of the dopant 23 is monitored through the load cell 26; the actual sublimation speed during the one batch is stored in a storing unit 42; and, the actual electric power (amount of heating) that has been applied to the heater 30 is stored in the storing unit 42.

In the next batch, the controller 40 reads the actual sublimation speed and the actual electric power (amount of heating) in the previous batch stored in the storing unit 42; compares those read data with the relationship between the sublimation speed and the electric power (amount of heating) stored in the storing unit 41; corrects the electric power to be applied to the heater 30; and, applies the corrected electric power to the heater 30. When the actual sublimation speed in the current batch is faster than the actual sublimation speed in the previous batch, the electric power to be applied to the heater 30 is decreased accordingly. As described above, the dopant 23 is sublimed at the desired sublimation speed, and the dopant 23 having the desired concentration is additionally doped to the melt 5.

Third Example

In the above-described second example, the electric power to be applied to the heater 30 is controlled by feeding back the actual sublimation speed in the previous batch to the current batch. However, it may be possible to control such that a fixed electric power corresponding to the desired sublimation speed is applied to the heater 30 on the basis of the relationship between the sublimation speed and the heater electric power value which is obtained through experiments in advance.

Hereinbelow, while a description of components same as those in the first and the second examples will be omitted as appropriate, components differing from those in the first and the second examples will be described. In a control device shown in FIG. 4, by obtaining a relationship between the sublimation speed and the amount of heating (electric power) in advance, the controller 40 controls the amount of heating (electric power) on the basis of the relationship obtained in advance.

In other words, by conducting experiments in advance, the relationship between the electric power (amount of heating) to be applied to the heater 30 and the sublimation speed is stored in the storing unit 41.

The controller 40 controls the electric power applied to the heater 30 by reading the data stored in the storing unit 41, and giving an electric power instruction to the heater 30 so as to maintain the electric power corresponding to the desired sublimation speed during one batch. Note that the flow rate of the carrier gas 17 is kept in a constant value during the one batch.

As described above, the dopant 23 is sublimed at the desired sublimation speed, and the dopant 23 of the desired concentration is additionally doped to the melt 5.

With the apparatus of each of the examples or the method of each of the examples as described above, a silicon single crystal ingot 6 is produced in a state where the dopant 23 is added in the low concentration from the shoulder portion to the first half of the straight body portion, and in a state where the dopant 23 is added in the high concentration after the first half of the straight body portion to the tail portion and has low-resistivity and N++ type electric properties.

Note that, although the dopant 23 is added in the low concentration from the shoulder portion to the first half of the straight body portion, it may be possible not to add any dopant 23 (non dope) from the shoulder portion to the first half of the straight body portion. In this case, with the apparatus of each of the examples or the method of each of the examples as described above, the silicon single crystal ingot 6 is produced in a state where no dopant 23 is added from the shoulder portion to the first half of the straight body portion, and in a state where the dopant 23 is added in the high concentration after the first half of the straight body portion to the tail portion and has low-resistivity and N++ type electric properties.

Note that, in each of the examples described above, the dopant 23 is supplied to the melt 5 through the blowing method, but the dopant 23 may be supplied to the melt 5 through the submerging method. Even in the case where the submerging method is employed, the accommodation chamber 21 also needs to be disposed at a position where the accommodation chamber 21 is less likely to be affected by the radiant heat from the melt 5.

Additionally, in the present embodiment, the dopant supply unit 20 is disposed at a position that does not interfere with the silicon single crystal 6 and the pulling mechanism 4, and, at the time of additional doping, the sublimed dopant 23 is introduced to the melt 5 while the silicon single crystal 6 is being pulled up. However, the dopant supply unit 20 may be disposed at a position where the silicon single crystal 6 and the pulling mechanism 4 are located.

For example, it may be possible to: place the dopant supply unit 20 at a position where the pulling mechanism 4 is located before the crystal growth starts; introduce the dopant 23 to the melt 5 by the dopant supply unit 20; then, remove the dopant supply unit 20; place the pulling mechanism 4 at the position where the dopant supply unit 20 has been placed; and the silicon single crystal 6 is pulled and grown.

Additionally, in this embodiment, it is assumed that the silicon single crystal 6 is pulled up, and silicon is employed as the semiconductor element. However, the semiconductor single crystal to be pulled is not only limited to the silicon single crystal, but also other semiconductor single crystal may be employed.

Figure 1:
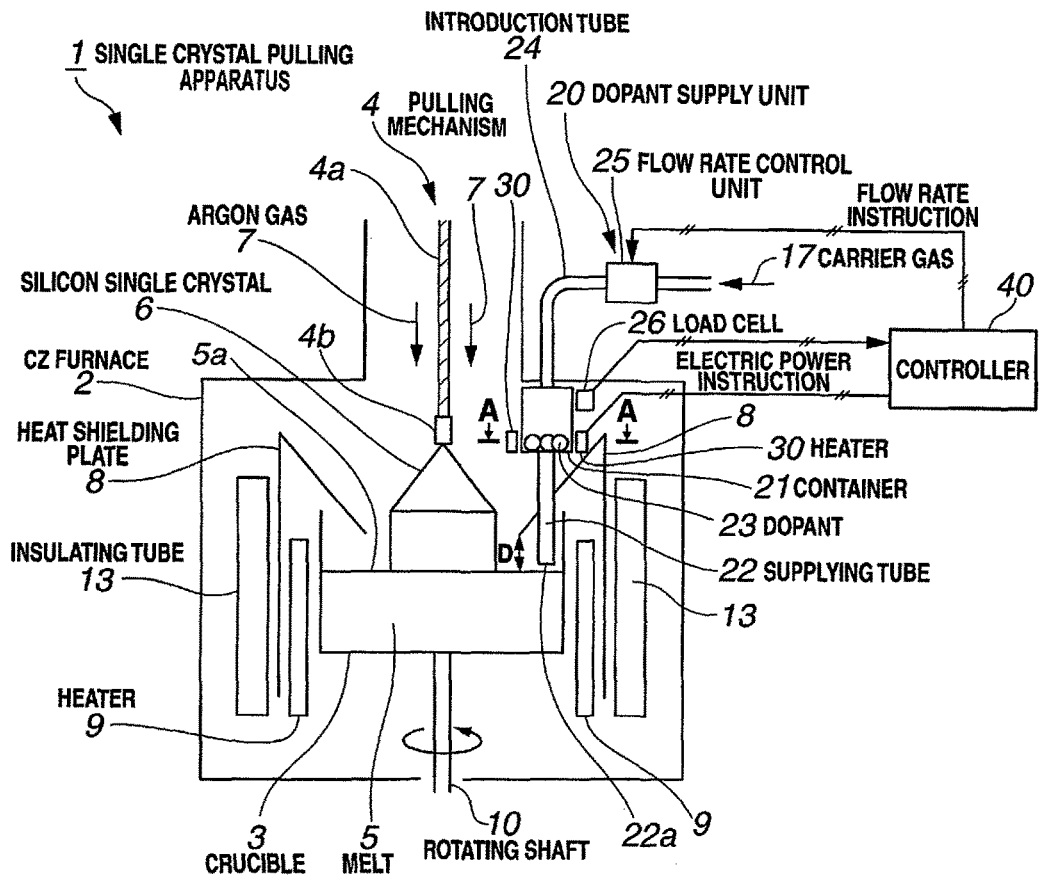
FIG. 1 is a side view showing an apparatus configuration of the first example.
Figure 2:
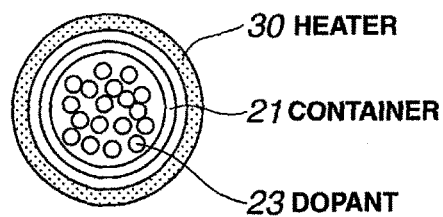
FIG. 2 is a sectional view showing a cross section of the dopant supply unit shown in FIG. 1.
Figure 3:
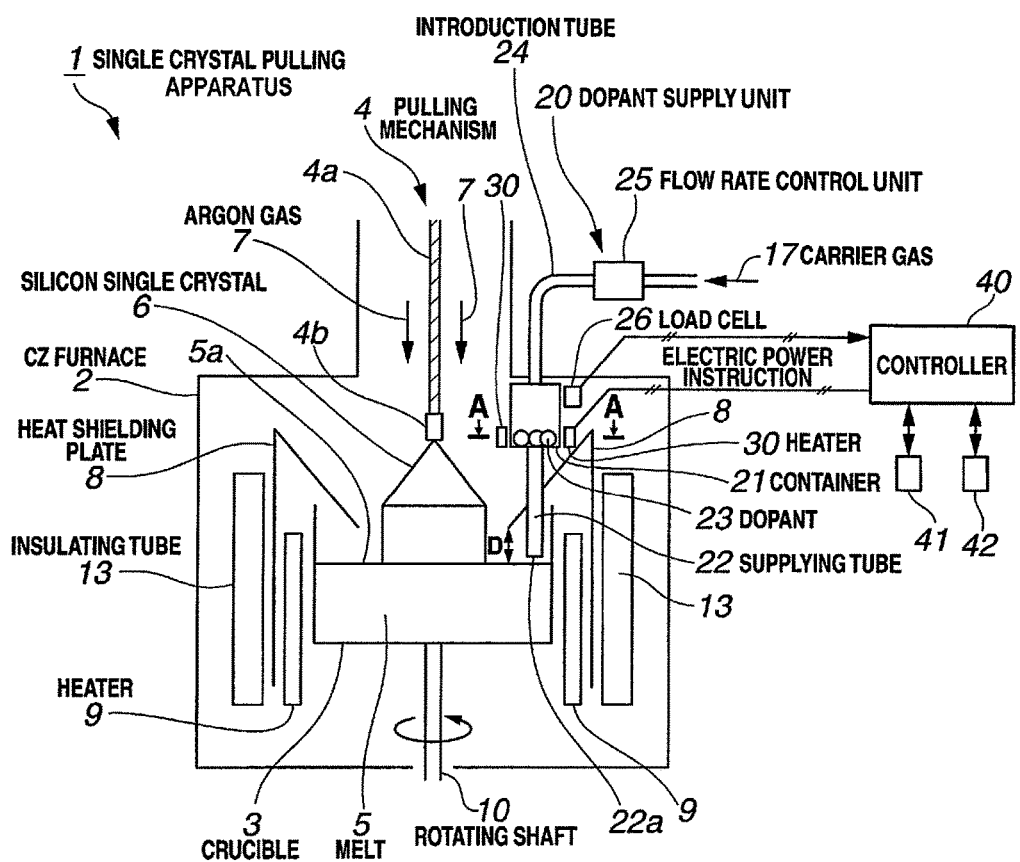
FIG. 3 is a side view showing an apparatus configuration of the second example.
Figure 4:
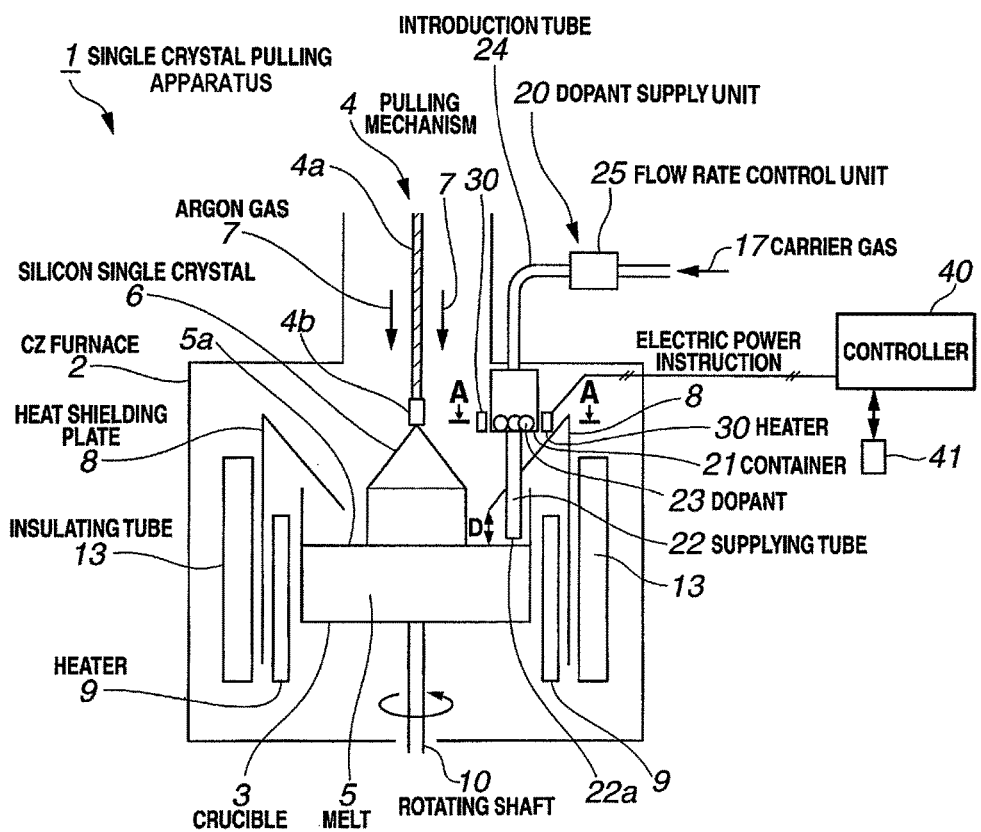
FIG. 4 is a side view showing an apparatus configuration of the third example.
Figure 5:
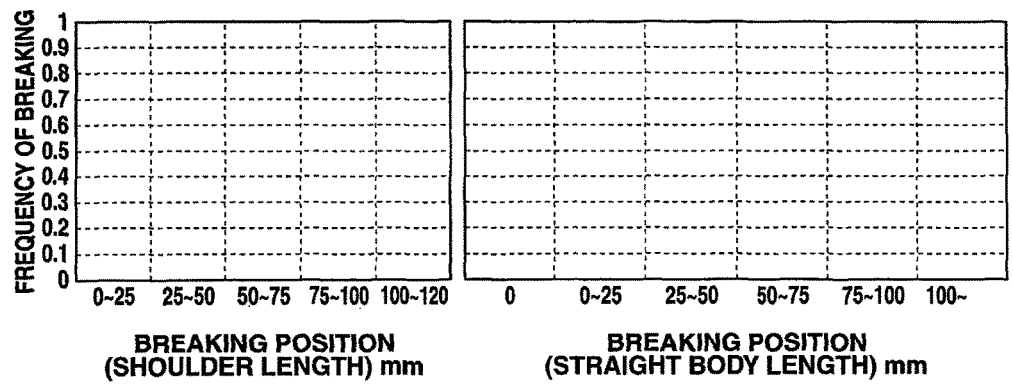
FIG. 5 is a graph showing a relationship between a place where the silicon single crystal breaks and frequency when the crystal break occurs.
Figure 6:
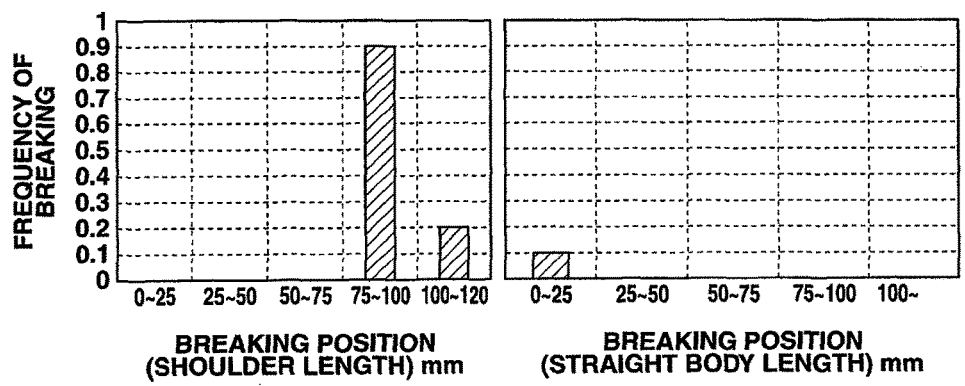
FIG. 6 is a graph showing a relationship between a place where the silicon single crystal breaks and frequency when the crystal break occurs.
Figure 7:
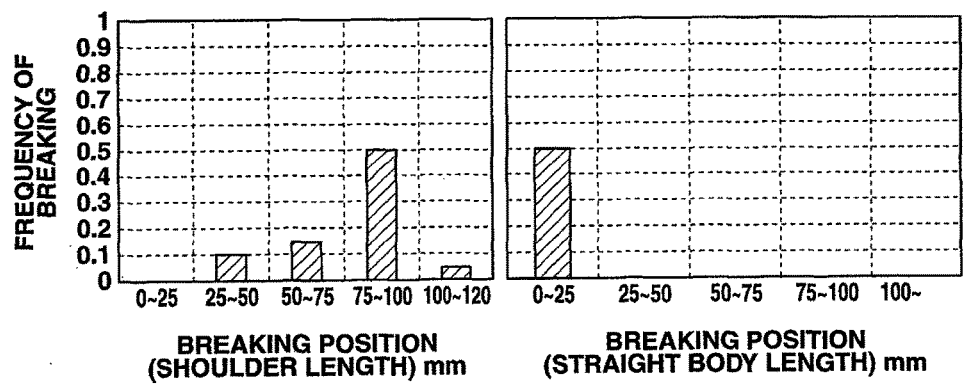
FIG. 7 is a graph showing a relationship between a place where the silicon single crystal breaks and frequency when the crystal break occurs.

The invention claimed is:

1. A producing method of a silicon single crystal, in which a dopant is supplied to a melt kept in a crucible within a furnace; and the silicon single crystal having the dopant added thereto is pulled up from the melt to grow the silicon single crystal, wherein a production apparatus of the method comprises:

a dopant supply unit comprising an accommodation chamber which accommodates a sublimable dopant, and a supplying tube which, when the dopant in the accommodation chamber is sublimed, blows the sublimed dopant to the melt to lead the sublimed dopant to the melt, and in which a distance between an opening edge and the melt is 10 mm or less, the method comprising:

adding no dopant to the melt until at least 100 mm of a straight body portion of the silicon single crystal is formed, and after at least 100 mm of the straight body portion of the silicon single crystal is formed, adding the dopant to the melt in a desired concentration by activating the dopant supply unit to sublime the dopant at a desired sublimation speed, and then supplying the sublimed dopant from the opening edge of the supplying tube to the melt.

2. The producing method of a silicon single crystal according to claim 1, wherein an N++ type silicon single crystal is produced.

3. The producing method of a silicon single crystal according to claim 1, wherein an N++ type silicon single crystal is produced by adding As or P as the dopant.

4. The method according to claim 1, wherein the concentration of dopant added to the melt is sufficient to lower a specific resistance value of the silicon single crystal to less than 0.01 Ω·cm.

5. The method according to claim 2, wherein the concentration of dopant added to the melt is sufficient to lower a specific resistance value of the silicon single crystal to less than 0.01 Ω·cm.

6. The method according to claim 3, wherein the concentration of dopant added to the melt is sufficient to lower a specific resistance value of the silicon single crystal to less than 0.01 Ω·cm.

* * * * *